United States Patent
Kwon et al.

(10) Patent No.: US 6,876,564 B2
(45) Date of Patent: Apr. 5, 2005

(54) INTEGRATED CIRCUIT DEVICE AND METHOD FOR APPLYING DIFFERENT TYPES OF SIGNALS TO INTERNAL CIRCUIT VIA ONE PIN

(75) Inventors: Kyoung-hwan Kwon, Seoul (KR); Kwang-sook Noh, Anyang (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/689,403

(22) Filed: Oct. 20, 2003

(65) Prior Publication Data

US 2004/0093478 A1 May 13, 2004

(30) Foreign Application Priority Data

Oct. 21, 2002 (KR) .................................. 10-2002-0064254

(51) Int. Cl.[7] ................................................. G11C 5/06
(52) U.S. Cl. .................... 365/63; 365/189.08; 365/201; 365/233
(58) Field of Search .......................... 365/63, 201, 233, 365/189.08

(56) References Cited

U.S. PATENT DOCUMENTS 6,330,180 B2 * 12/2001 Noro et al. ................. 365/145
6,424,142 B1 * 7/2002 Kato et al. ................. 324/158.1
6,677,774 B2 * 1/2004 Buffet et al. ................ 324/765

* cited by examiner

Primary Examiner—Son T. Dinh
(74) Attorney, Agent, or Firm—Mills & Onello, LLP

(57) ABSTRACT

Provided are an integrated circuit and a method thereof, in which different types of signals can be applied to an internal circuit via one pin. The integrated circuit device includes a distribution unit, a level fixing unit, and an activation unit. The distribution unit receives and outputs a first input signal input via the first input pin, and receives and outputs a second input signal input via the first input pin in response to a control signal. The level fixing unit receives the first input signal from the distribution unit and applies a signal having the same voltage level as the first input signal to a first internal circuit in response to the control signal. The activation unit receives the second input signal input via the second input pin and then applies the second input signal to a second internal circuit or applies the second input signal output from the distribution unit to the second internal circuit in response to the control signal.

20 Claims, 3 Drawing Sheets

INTEGRATED CIRCUIT DEVICE AND METHOD FOR APPLYING DIFFERENT TYPES OF SIGNALS TO INTERNAL CIRCUIT VIA ONE PIN

BACKGROUND OF THE INVENTION

This application claims the priority of Korean Patent Application No. 2002-64254, filed on Oct. 21, 2002, in the Korean Intellectual Property Office, the contents of which are incorporated herein in their entirety by reference.

1. Field of the Invention

The present invention relates to an integrated circuit device, and more particularly, to an integrated circuit device capable of applying different types of signals to an internal circuit via one pin and a method thereof.

2. Description of the Related Art

The storage capacity and operation speed of semiconductor integrated circuit devices continue to increase. In accordance with this tendency, the number of addresses of a semiconductor integrated circuit device must also increase. However, since a conventional apparatus for testing semiconductor integrated circuit devices has a fixed number of input ports, it is difficult to test semiconductor integrated circuit devices having an increased number of addresses using the conventional testing apparatus. Of course, it is possible to increase the number of input ports of the testing apparatus in order to solve this problem. However, this undesirably causes the testing costs to increase.

SUMMARY OF THE INVENTION

The present invention provides an integrated circuit device which provides different types of signals to an internal circuit via one pin.

The present invention also provides a method of providing different kinds of signals to an internal circuit via one pin.

According to an aspect of the present invention, there is provided an integrated circuit device including a first input pin through which a signal is applied to a first internal circuit and a second input pin through which a signal is applied to a second internal circuit. The integrated circuit device includes a distribution unit, a level fixing unit, and an activation unit. The distribution unit receives and outputs a first input signal input via the first input pin, and receives and outputs a second input signal input via the first input pin in response to a control signal. The level fixing unit receives the first input signal from the distribution unit and applies a signal having the same voltage level as the first input signal to a first internal circuit in response to the control signal. The activation unit receives the second input signal input via the second input pin and applies the second input signal to a second internal circuit or applies the second input signal output from the distribution unit to the second internal circuit in response to the control signal.

Preferably, the first input signal is maintained at either a first logic level or a second logic level during a specific operation mode of the integrated circuit device.

Preferably, the first and second input signals are different types of signals.

Preferably, the control signal is generated in a specific operation mode of the integrated circuit device.

Preferably, the control signal is a mode register set (MRS) signal.

Preferably, the integrated circuit device is a synchronous dynamic random access memory (SDRAM), a RAMBUS DRAM, or a double data rate (DDR) DRAM.

According to another aspect of the present invention, there is provided an integrated circuit device including first through N-th address pins, through which first through N-th address signals are respectively applied to an internal circuit, and a clock activation pin, through which a clock activation signal is input. The integrated circuit device includes an activation unit, a level fixing unit, and a distribution unit. The activation unit applies the N-th address signal input via the N-th address pin to the internal circuit or applies a predetermined address test signal to the internal circuit in response to a control signal. The level fixing unit receives and outputs the clock activation signal input via the clock activation pin and outputs a signal having the same voltage level as the clock activation signal in response to the control signal. The distribution unit outputs the N-th address signal input via the clock activation pin as an address test signal in response to the control signal.

Preferably, the activation unit applies the N-th address signal input via the N-th address pin to the internal circuit when the control signal has a first logic level, and applies the address test signal to the internal circuit when the control signal has a second logic level.

Preferably, the level fixing unit receives and outputs a clock activation signal input via the clock activation pin when the control signal has a first logic level, and outputs a signal having the same voltage level as the clock activation signal when the control signal has a second logic level.

Preferably, the distribution unit is a logic NAND means performing a logic NAND operation on the control signal and the N-th address signal.

Preferably, the activation unit includes an inverter which inverts the control signal, a first logic NAND means which performs a logic NAND operation on an output signal of the inverter and the N-th address signal input via the N-th address pin, and a second logic NAND means which performs a logic NAND operation on an output signal of the first logic NAND means and the address test signal.

Preferably, the level fixing unit includes a first inverter which inverts and outputs the control signal, a second inverter which inverts and outputs a signal input via the clock activation pin, and a logic NAND means which performs a logic NAND operation on an output signal of the first inverter and an output signal of the second inverter.

Preferably, the control signal is generated to have a second logic level in a test mode of the integrated circuit device.

Preferably, the control signal is an MRS signal.

Preferably, the integrated circuit device is a SDRAM, a RAMBUS DRAM, or a DDR DRAM.

According to still another aspect of the present invention, there is provided a method of applying an N-th address signal to an internal circuit via a clock activation pin in a test mode of an integrated circuit device including first through N-th address pins, through which first through N-th address signals are respectively applied to an internal circuit, and a clock activation pin, through which a clock activation signal is input. The method includes (a) determining whether the operation mode of the integrated circuit device is a test mode and applying the N-th address signal to the internal circuit via the N-th address pin if the operation mode of the integrated circuit device is not a test mode, (b) outputting a signal having the same voltage level as the clock activation signal input via the clock activation pin in response to a predetermined control signal if the operation mode of the integrated circuit device is a test mode, (c) outputting the N-th address signal input via the clock activation signal as an address test signal in response to the control signal, and (d) applying the address test signal to the internal circuit in response to the control signal.

Preferably, in step (b), when the control signal has a first logic level, a clock activation signal input via the clock activation pin is received and then output, and when the control signal has a second logic level, a signal having the same voltage level as the clock activation signal is output.

Preferably, in step (d), when the control signal has a first logic level, the N-th address signal input via the N-th address pin is applied to the internal circuit, and when the control signal has a second logic level, the address test signal is applied to the internal circuit.

Preferably, the control signal is generated to have a second logic level in a test mode of the integrated circuit device.

Preferably, the control signal is an MRS signal.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
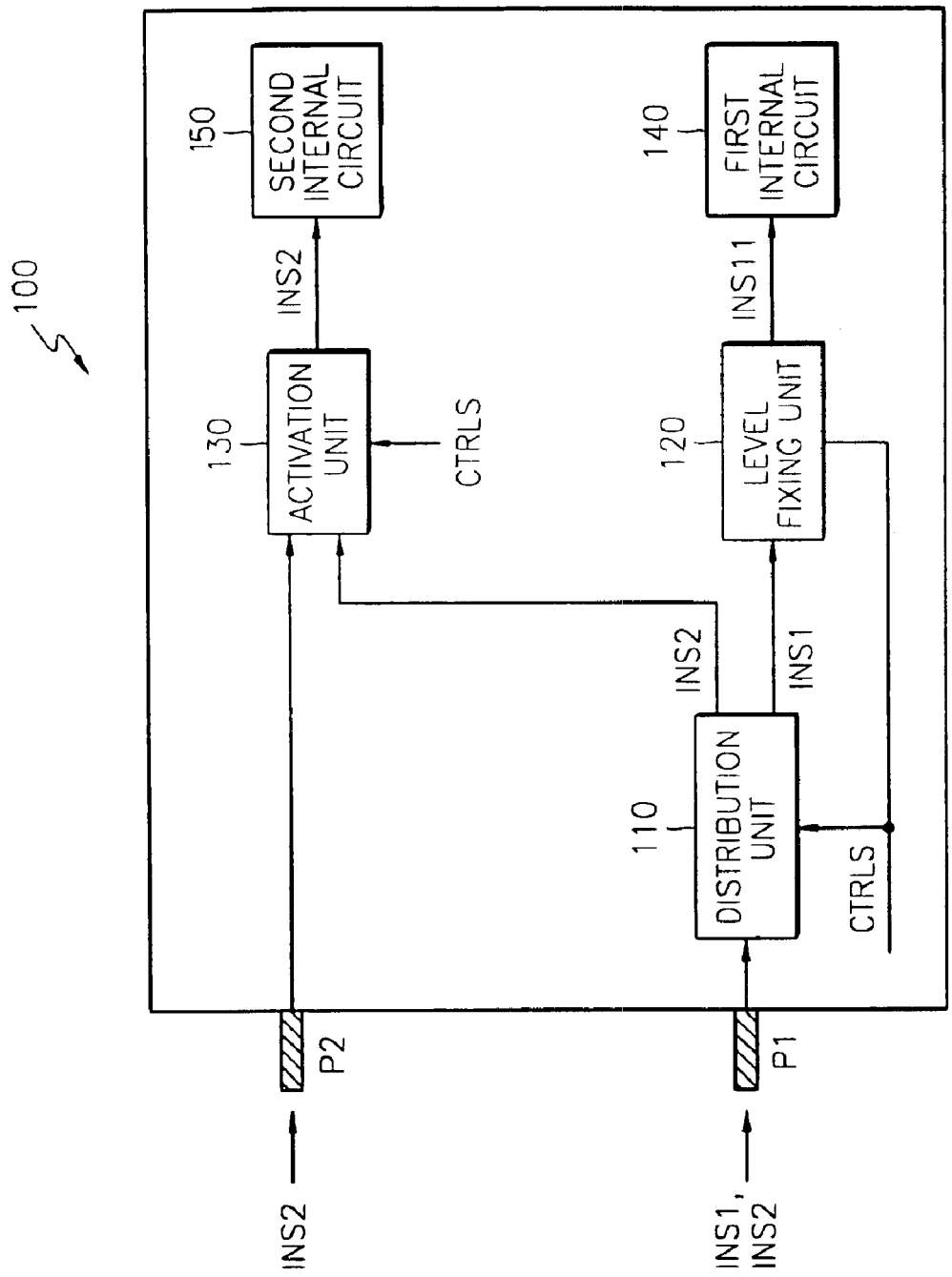
FIG. 1 is a block diagram of an integrated circuit device according to a preferred embodiment of the present invention.

FIG. 1 is a block diagram of an integrated circuit device according to a preferred embodiment of the present invention. Referring to FIG. 1, the integrated circuit device includes a first input pin P1, which receives signals applied to a first internal circuit 140; a second input pin P2, which receives signals applied to a second internal circuit 150; a distribution unit 110; a level fixing unit 120; and an activation unit 130.

As the operation speed and storage capacity of integrated circuit devices increase, the number of signals input into each of the integrated circuit devices increases. If an integrated circuit device is designed so that a plurality of input signals share one pin, it is possible to reduce manufacturing costs and take advantage of a conventional testing apparatus by reducing the number of pins necessary to receive input signals, irrespective of the increase in the number of input signals.

To provide the above advantages, the integrated circuit device 100 of the present invention takes advantage of the following principle. If a first input signal INS1 input into the first input pin P1 is maintained at a predetermined logic level during a specific operation mode of the integrated circuit device 100, the logic level of the first input signal INS1 is maintained at a predetermined value.

Thereafter, a second input signal INS2 is input via the first input pin P1 and then transmitted to the second internal circuit 150. In short, in the specific operation mode of the integrated circuit device 100, the second input signal INS2 is input via the first input pin P1 and then transmitted to the second internal circuit 150. Accordingly, it is possible to prevent an increase in the number of pins.

In a typical operation mode of the integrated circuit device 100, the first input signal INS1 is applied to the first input pin P1, and the second input signal INS2 is applied to the second input pin P2. On the other hand, in the specific operation mode of the integrated circuit device 100, for example, in a test mode, the first input signal INS1 and the second input signal INS2 are both applied to the first input pin P1.

Here, the first and second input signals INS1 and INS2 are different types of signals. For example, if the first input signal INS1 is a clock enabling signal, then the second input signal INS2 may be an address signal. The first input signal INS1 is maintained at either a first logic level or a second logic level during the specific operation mode of the integrated circuit device 100, for example, during a test mode.

The distribution unit 110 receives the first input signal INS1 via the first input pin P1 and then outputs the first input signal INS1. In the specific operation mode of the integrated circuit device 100, for example, in a test mode, the distribution unit 110 receives the second input signal INS2 via the first input pin P1 and outputs the second input signal INS2.

That is, in a typical operation mode of the integrated circuit device 100, the distribution unit 110 receives and then outputs the first input signal INS1, and in the specific operation mode (test mode) of the integrated circuit device 100, it receives and outputs the second input signal INS2.

A control signal CTRLS is generated during the specific operation mode of the integrated circuit device 100. The control signal CTRLS is a mode register set (MRS) signal. Accordingly, when the operation mode of the integrated circuit device 100 is switched to the specific operation mode, for example, a test mode, the control signal CTRLS can be generated by combining MRS signals that are generated in a test mode.

The level fixing unit 120 receives the first input signal INS1 output from the distribution unit 110, maintains the voltage of the first input signal INS1 at a predetermined level in response to the control signal CTRLS, and then applies the first input signal INS1 to the first internal circuit 140. In a typical operation mode of the integration circuit device 100, the first input signal INS1 passes through the level fixing unit 120 and is directly applied to the first internal circuit 140.

However, when the operation mode of the integrated circuit device 100 is switched to the specific mode, i.e., a test mode, the first input signal INS1 is not input into the first input pin P1. Instead, the second input signal INS2 is input into the first input pin P1. Accordingly, in order to provide the same effects as in a case where the first input signal INS1 is applied to the first internal circuit 140, the level fixing unit 120 applies a signal INS11 having the same voltage level as the first input signal INS1 to the first internal circuit 140.

Since the first input signal INS1 is maintained at a predetermined level during the specific mode of the integrated circuit device 100, the signal INS11 is also maintained at a predetermined level during the specific mode of the integrated circuit device 100.

In a typical mode of the integrated circuit device 100, the activation unit 130 receives the second input signal INS2 via the second input pin P2 and applies the second input signal INS2 to the second internal circuit 150. On the other hand, in the specific mode of the integrated circuit device 100, for example, in a test mode, the activation unit 130 applies the second input signal INS2 output from the distribution unit 110 to the second internal circuit 150 in response to the control signal CTRLS.

Accordingly, when the operation mode of the integrated circuit device 100 is switched to the specific mode, the control signal CTRLS is generated, and the second input signal INS2 can be applied to the second internal circuit 150 via the first input pin P1 in response to the control signal CTRLS.

If the specific mode of the integrated circuit device 100 is a test mode, it is possible to reduce the number of pins to less than the number of signals input into the integrated circuit device 100. Accordingly, it is also possible to reduce the number of pins that a testing apparatus is required to have. Therefore, it is possible to use a conventional testing apparatus irrespective of the increase in the number of pins caused by the increase in the number of signals and to reduce the testing costs.

The integrated circuit device 100 may be a synchronous dynamic random access memory (SDRAM), a RAMBUS DRAM, or a double data rate (DDR) DRAM.

Figure 2:
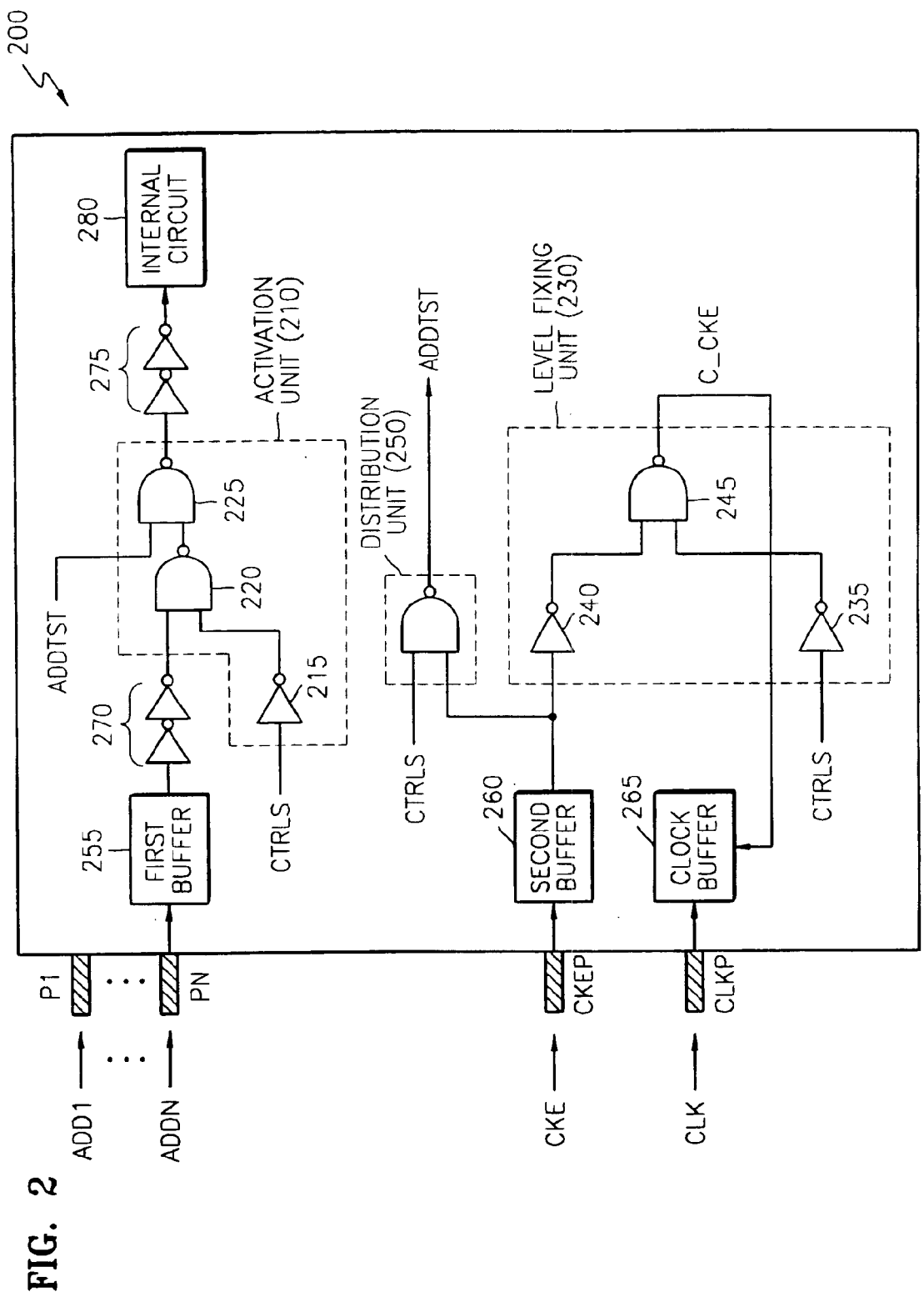
FIG. 2 is a block diagram of an integrated circuit device according to another preferred embodiment of the present invention.
Figure 3:
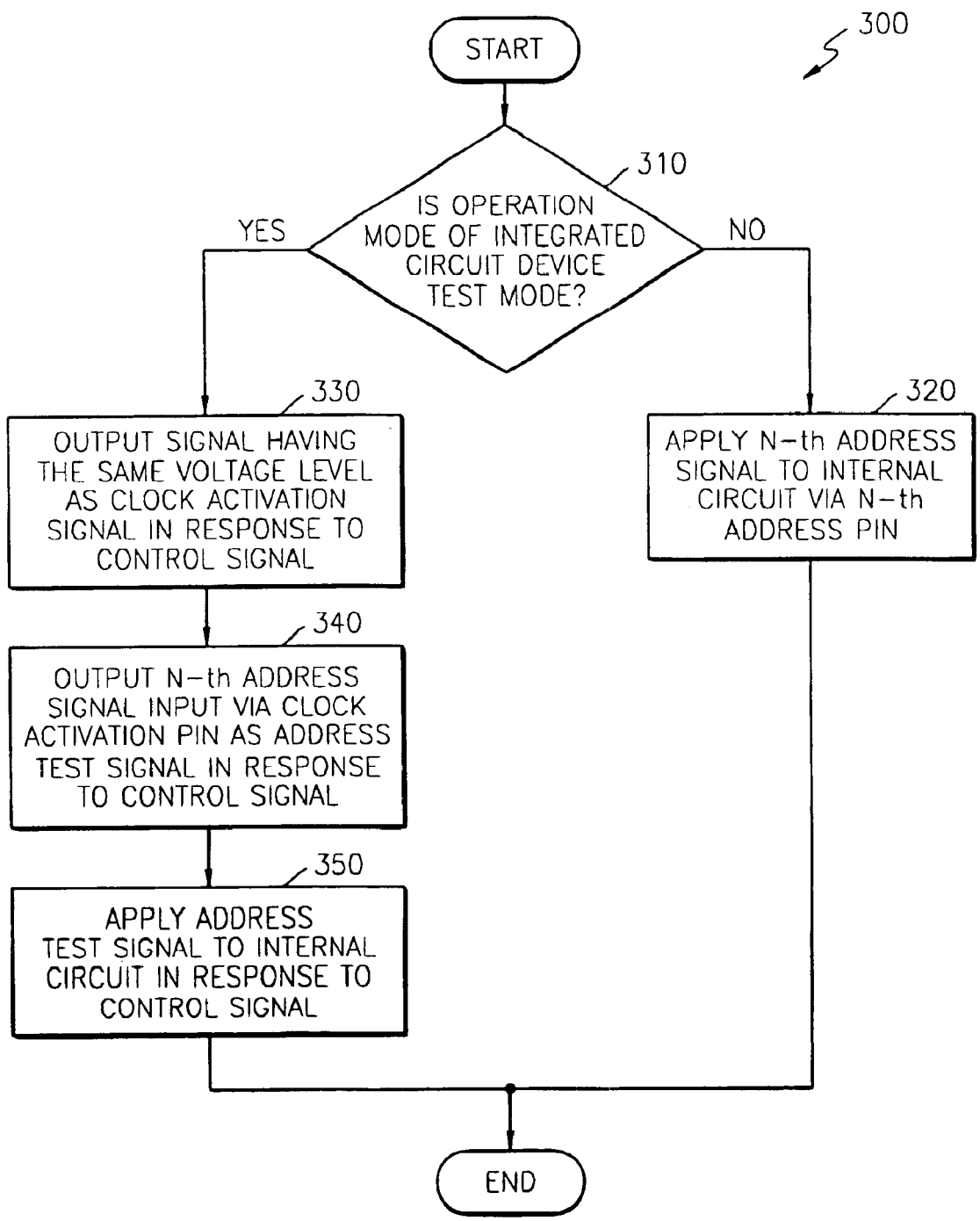
FIG. 3 is a flowchart of the operation of the integrated circuit device of FIG. 2.

FIG. 2 is a block diagram of an integrated circuit device according to another preferred embodiment of the present invention, and FIG. 3 is a flowchart of the operation of the integrated circuit device shown in FIG. 2.

Referring to FIG. 2, an integrated circuit device 200 includes first through N-th address pins P1 through PN receiving first through N-th address signals ADD1 through ADDN, respectively, to be applied to an internal circuit 280; a clock activation pin CKEP receiving a clock activation signal CKE; an activation unit 210; a level fixing unit 230; and a distribution unit 250.

Referring to FIGS. 2 and 3, whether the operation mode of the integrated circuit device 200 is a test mode is determined in step 310. If the operation mode is determined not to be a test mode, the N-th address signal ADDN is applied to the internal circuit 280 via the N-th address pin PN in step 320.

If the operation mode of the integrated circuit device 200 is a typical operation mode other than a test mode, the first through N-th address signals ADD1 through ADDN are applied to the integrated circuit device 200 via the first through N-th address pins P1 through PN, respectively, and to their corresponding internal circuits. In FIG. 2, only the internal circuit 280, to which the N-th address signal ADDN is applied, is shown.

In the typical operation mode of the integrated circuit device 200, the activation unit 210 applies the N-th address signal ADDN input thereinto via the N-th address pin PN, to the internal circuit 280. However, in the test mode of the integrated circuit device 200, the activation unit 210 applies an address test signal ADDTST to the internal circuit 280 in response to a control signal CTRLS, which will be described in greater detail later.

The control signal CTRLS has a first logic level during the typical operation mode of the integrated circuit device 200. On the other hand, the control signal CTRLS has a second logic level during the test mode of the integrated circuit device 200. Here, for the convenience of explanation, it is assumed that the first logic level and the second logic level represent a low level and a high level, respectively.

Accordingly, when the control signal CTRLS reaches the first logic level, the activation unit 210 applies the N-th address signal ADDN input thereinto via the N-th address pin PN, to the internal circuit 280. When the control signal CTRLS reaches the second logic level, the activation unit 210 applies the address test signal ADDTST to the internal circuit 280.

The activation unit 210 includes an inverter 215 which inverts the control signal CTRLS, a first logic NAND means 220 which performs a logic NAND operation on an output signal of the inverter 215 and the N-th address signal ADDN, and a second logic NAND means 225 which performs a logic NAND operation on an output signal of the first logic NAND means 220 and the address test signal ADDTST. In FIG. 2, reference numerals 270 and 275 represent buffers.

Since the control signal CTRLS has the first logic level, i.e., a low level, during the typical operation mode of the integrated circuit device 200, the activation unit 210 receives the N-th address signal ADDN and applies the N-th address signal ADDN to the internal circuit 280.

During the typical operation mode of the integrated circuit device 200, the clock activation signal CKE has a high level and is input into the integrated circuit device 200 via the clock activation pin CKEP. The clock activation signal CKE is maintained at a high level while the integrated circuit device 200 is turned on. The clock activation signal CKE input into the integrated circuit device 200 is applied to a clock buffer 265, and then the clock activation signal CKE activates a clock signal input into the integrated circuit device 200 via a clock pin CLKP.

In the typical operation mode of the integrated circuit device 200, the level fixing unit 230 receives and outputs the clock activation signal CKE input via the clock activation pin CKEP. On the other hand, in the test mode of the integrated circuit device 200, the level fixing unit 230 outputs a signal C_CKE having the same voltage level as the clock activation signal CKE, in response to the control signal CTRLS.

That is, when the control signal CTRLS has the first logic level, the level fixing unit 230 receives and outputs the clock activation signal CKE input via the clock activation pin CKEP. On the other hand, when the control signal CTRLS has the second logic level, the level fixing unit 230 outputs the signal C_CKE having the same voltage level as the clock activation signal CKE.

The level fixing unit 230 includes a first inverter 235 which inverts and outputs the control signal CTRLS, a second inverter 240 which inverts and outputs a signal applied thereto via the clock activation pin CKEP, and a logic NAND means 245 which performs a logic NAND operation on an output signal of the first inverter 235 and an output signal of the second inverter 240.

When the control signal CTRLS has the first logic level, i.e., a low level, the output signal of the first inverter 235 has a high level, and thus the clock activation signal CKE is output via the logic NAND means 245.

When the operation mode of the integrated circuit device 200 is a test mode, the signal C_CKE, which has the same voltage level as the clock activation signal CKE, is output in response to the control signal which is input into the integrated circuit device 200 via the clock activation pin CKEP in step 330.

That is, in the test mode of the integrated circuit device 200, a control signal CTRLS having the second logic level, i.e., a high level, is generated. The control signal CTRLS is an MRS signal. Accordingly, when the operation mode of the integrated circuit device 200 is switched to a test mode, the control signal CTRLS can be generated by combining MRS signals. When the control signal CTRLS has a high level, the output signal of the first inverter 235 has a low level.

Since one of the two input signals of the logic NAND means 245 has a low level, the logic NAND means 245 outputs a high-level signal C__CKE irrespective of the logic level of the other input signal. While the control signal CTRLS is maintained at a high level, the level fixing unit 230 outputs the signal C__CKE having the same voltage level as the clock activation signal CKE.

Accordingly, even though the clock activation signal CKE has not been input into the integrated circuit device 200 via the clock activation pin CKEP, the clock signal CLK can be activated due to the high-level signal C__CKE input into the clock buffer 265. That is, the clock buffer 265 regards the situation as clock activation signal CKE being continuously applied to the integrated circuit device 200.

The N-th address signal ADDN input via the clock activation pin CKEP is output as the address test signal ADDTST in responses to the control signal CTRLS in step 340.

The distribution unit 250 outputs the N-th address signal ADDN input into the integrated circuit device 200 via the clock activation pin CKEP as the address test signal ADDTST in response to the control signal CTRLS having a high level. The distribution unit 250 is a logic NAND means which performs a logic NAND operation on the control signal CTRLS and the N-th address signal ADDN. Since one of the two input signals of the distribution unit 250 has a high level, the address test signal ADDTST is the same as the N-th address signal ADDN.

The address test signal ADDTST is applied to the internal circuit 280 in response to the control signal CTRLS in step 350.

When the control signal CTRLS has a high level, the output signal of the inverter 215 of the activation unit 210 has a low level, and thus the output signal of the first logic NAND means 220 always has a high level. Since one of the two input signals of the second logic NAND means 225 is always maintained at a high level, the output signal of the second logic NAND means 225 is the same as the address test signal ADDTST.

The address test signal ADDTST is the same as the N-th address signal ADDN, and thus the N-th address signal ADDN input via the clock activation pin CKEP in the test mode of the integrated circuit device 200 is applied to the internal circuit 280.

The integrated circuit device 200 may be an SDRAM, a Rambus DRAM, or a DDR DRAM.

Due to the increase in the operation speed of integrated circuit devices, the number of address signals increases. Supposing that the N-th address signal ADDN is a newly added signal due to the improved operation speed of the integrated circuit device 200, a channel for the N-th address signal ADDN must be additionally installed in a testing apparatus, which results in the increase of testing costs. In other words, there is no way to test the N-th address signal using a conventional testing apparatus without additionally installing a channel for the N-th address signal ADDN in the conventional testing apparatus. However, according to the present invention, it is possible to use the conventional testing apparatus to test integrated circuit devices irrespective of the increase in the number of address signals.

According to the present invention, even if the number of input signals increases due to the increase in the operation speed of an integrated circuit device, it is possible to prevent an increase in the number of pins (of a testing apparatus) by making signals input into the integrated circuit device share input pins.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit device including a first input pin through which a signal is applied to a first internal circuit and a second input pin through which a signal is applied to a second internal circuit, the integrated circuit device comprising:
   a distribution unit which receives and outputs a first input signal input via the first input pin, and receives and outputs a second input signal input via the first input pin in response to a control signal;
   a level fixing unit which receives the first input signal from the distribution unit and applies a signal having the same voltage level as the first input signal to a first internal circuit in response to the control signal; and
   an activation unit which receives the second input signal input via the second input pin and applies the second input signal to a second internal circuit or applies the second input signal output from the distribution unit to the second internal circuit in response to the control signal.

2. The integrated circuit device of claim 1, wherein the first input signal is maintained at either a first logic level or a second logic level during a specific operation mode of the integrated circuit device.

3. The integrated circuit device of claim 1, wherein the first and second input signals are different types of signals.

4. The integrated circuit device of claim 1, wherein the control signal is generated in a specific operation mode of the integrated circuit device.

5. The integrated circuit device of claim 1, wherein the control signal is a mode register set (MRS) signal.

6. The integrated circuit device of claim 1, wherein the integrated circuit device is one of a synchronous dynamic random access memory (SDRAM), a RAMBUS DRAM, and a double data rate (DDR) DRAM.

7. An integrated circuit device including first through N-th address pins, through which first through N-th address signals are respectively applied to an internal circuit, and a clock activation pin, through which a clock activation signal is input, the integrated circuit device comprising:
   an activation unit which applies the N-th address signal input via the N-th address pin to the internal circuit or applies a predetermined address test signal to the internal circuit in response to a control signal;
   a level fixing unit which receives and outputs the clock activation signal input via the clock activation pin and outputs a signal having the same voltage level as the clock activation signal in response to the control signal; and
   a distribution unit which outputs the N-th address signal input via the clock activation pin as an address test signal in response to the control signal.

8. The integrated circuit device of claim 7, wherein the activation unit applies the N-th address signal input via the N-th address pin to the internal circuit when the control signal has a first logic level, and applies the address test signal to the internal circuit when the control signal has a second logic level.

9. The integrated circuit device of claim 7, wherein the level fixing unit receives and outputs a clock activation signal input via the clock activation pin when the control signal has a first logic level, and outputs a signal having the same voltage level as the clock activation signal when the control signal has a second logic level.

10. The integrated circuit device of claim 7, wherein the distribution unit is a logic NAND means performing a logic NAND operation on the control signal and the N-th address signal.

11. The integrated circuit device of claim 7, wherein the activation unit comprises:
   an inverter which inverts the control signal;
   a first logic NAND means which performs a logic NAND operation on an output signal of the inverter and the N-th address signal input via the N-th address pin; and
   a second logic NAND means which performs a logic NAND operation on an output signal of the first logic NAND means and the address test signal.

12. The integrated circuit device of claim 7, wherein the level fixing unit comprises:
   a first inverter which inverts and outputs the control signal;
   a second inverter which inverts and outputs a signal input via the clock activation pin; and
   a logic NAND means which performs a logic NAND operation on an output signal of the first inverter and an output signal of the second inverter.

13. The integrated circuit device of claim 7, wherein the control signal is generated to have a second logic level in a test mode of the integrated circuit device.

14. The integrated circuit device of claim 7, wherein the control signal is an MRS signal.

15. The integrated circuit device of claim 7, wherein the integrated circuit is one of a SDRAM, a Rambus DRAM, and a DDR DRAM.

16. A method of applying an N-th address signal to an internal circuit via a clock activation pin in a test mode of an integrated circuit device including first through N-th address pins, through which first through N-th address signals are respectively applied to an internal circuit, and a clock activation pin, through which a clock activation signal is input, the method comprising:
   (a) determining whether the operation mode of the integrated circuit device is a test mode and applying the N-th address signal to the internal circuit via the N-th address pin if the operation mode of the integrated circuit device is not a test mode;
   (b) outputting a signal having the same voltage level as the clock activation signal input via the clock activation pin in response to a predetermined control signal if the operation mode of the integrated circuit device is a test mode;
   (c) outputting the N-th address signal input via the clock activation signal as an address test signal in response to the control signal; and
   (d) applying the address test signal to the internal circuit in response to the control signal.

17. The method of claim 16, wherein in step (b), when the control signal has a first logic level, a clock activation signal input via the clock activation pin is received and then output, and when the control signal has a second logic level, a signal having the same voltage level as the clock activation signal is output.

18. The method of claim 16, wherein in step (d), when the control signal has a first logic level, the N-th address signal input via the N-th address pin is applied to the internal circuit, and when the control signal has a second logic level, the address test signal is applied to the internal circuit.

19. The method of claim 16, wherein the control signal is generated to have a second logic level in a test mode of the integrated circuit device.

20. The method of claim 16, wherein the control signal is an MRS signal.

* * * * *